United States Patent [19]

Bachmann et al.

[11] 3,922,553

[45] Nov. 25, 1975

[54] NEAR-INFRARED LIGHT EMITTING DIODES AND DETECTORS EMPLOYING $CdSnP_2$:InP HETERODIODES

[75] Inventors: Klaus Jurgen Bachmann, Piscataway; Ernest Buehler, Chatham; Joseph Leo Shay, Marlboro; Jack Harry Wernick, Madison, all of N.J.

[73] Assignee: Bell Telephone Laboratories, Incorporated, Murray Hill, N.J.

[22] Filed: Aug. 21, 1974

[21] Appl. No.: 499,172

Related U.S. Application Data

[60] Division of Ser. No. 382,021, July 23, 1973, which is a continuation-in-part of Ser. No. 315,359, Dec. 15, 1972, abandoned.

[52] U.S. Cl. .................. 250/370; 250/338; 357/16; 357/17

[51] Int. Cl.[2] ....... ........... H01L 29/161; G01T 1/22

[58] Field of Search ........... 250/338, 370, 495, 458; 357/16, 17, 18, 30

[56] References Cited

UNITED STATES PATENTS

| | | | |
|---|---|---|---|
| 3,290,175 | 12/1966 | Cusano et al. | 357/16 |
| 3,309,553 | 3/1967 | Kroemer | 357/16 |
| 3,636,354 | 1/1972 | Leheny et al. | 250/370 |

*Primary Examiner*—Harold A. Dixon
*Attorney, Agent, or Firm*—Wilford L. Wisner

[57] ABSTRACT

There are disclosed diodes for detection and diodes for emission of near-infrared radiation. Such a diode employs an epitaxial layer of n-type cadmium tin phosphide grown on a p-type InP substrate, which is the light-transmitting window of the device. Also disclosed is a tipping technique of epitaxial growth in which the conditions of the substrate crystal and the tin-rich melt are controlled to obtain high quality heterojunctions. A mixture of tin, phosphorus, and cadmium is prepared in a separate saturation procedure to minimize substrate degradation during epitaxial growth. The indium phosphide substrates are high quality and p-type with predominantly cadmium or zinc doping.

In some diodes the $CdSnP_2$ epitaxial layers contain some indium traceable to dissolution of the indium phosphide substrate by the tin solution prior to nucleation and growth of the epitaxial layer. Later diodes grown from solutions containing controlled amounts of indium intentionally added to the presaturated melt, efficiently emitted infrared light near 1.0 $\mu$.

8 Claims, 9 Drawing Figures

NEAR-INFRARED LIGHT EMITTING DIODES AND DETECTORS EMPLOYING $CdSnP_2$:InP HETERODIODES

CROSS REFERENCE TO RELATED APPLICATION

This is a division of application Ser. 382,021 filed July 23, 1973, which is a continuation-in-part of patent application Ser. No. 315,359 filed Dec. 15, 1972, the latter being abandoned.

BACKGROUND OF THE INVENTION

This invention relates to light-detecting diodes and light-emitting diodes for near-infrared radiation, particularly radiation in the wavelength range from about one micrometer to nearly two micrometers.

Since the advent of the neodymium ion laser employing solid-state hosts, such as yttrium aluminum garnet, and especially since the recent availability of glass fibers with low loss at the 1.06 micrometers wavelength of the typical neodymium ion laser, an intensive search has continued for improved detectors for coherent light at or near this infrared wavelength and for improved light-emitting diodes having emission wavelengths in the same general range to allow implementation of systems that are capable of a complete range of communication functions. Such diodes would hasten the first commercial availability of optical communication links.

In the prior patent of one of us, J. L. Shay with R. F. Leheny, U.S. Pat. No. 3,636,354, there is disclosed the use of a cadmium tin phosphide crystal as a detector for wavelengths at or near 1.06 micrometers. While such devices remain attractive, the more readily made versions of that device have less than the theoretically available efficiency because of the use of a photoconductive effect in bulk material. Moreover, the most efficient versions are relatively more difficult to make. For example, it has been rather difficult to obtain p-type cadmium tin phosphide for use in a cadmium tin phosphide p-n junction device.

SUMMARY OF THE INVENTION

Our present divisional patent application is directed to the devices not claimed in our above-cited copending parent application, specifically, our discovery of an improved detector for radiation in the 1.0 to 1.3 micrometer wavelength range. The detector is a photovoltaic detector based on a heterojunction between cadmium tin phosphide and indium phosphide of opposite conductivity types. The device employs an epitaxial layer of n-type cadmium tin phosphide on a single crystal substrate of indium phosphide through which the light passes to be absorbed at the junction of the heterodiode.

Our present divisional patent application is also directed to emitting devices based on our further discovery of surprisingly efficient electroluminescence, as high as two percent internal quantum efficiency at room temperatures, from a similar diode having p-type and n-type regions of somewhat higher resistivity than our previous diodes and having a heterojunction of improved quality. This surprisingly efficient electroluminescence is tentatively attributed to properties of the diodes which result from improved starting materials including a high quality indium phosphide substrate, and improved epitaxial growth techniques for the growth of the cadmium tin phosphide epitaxial layer on the InP substrate.

The improved processing aspects of our invention are disclosed and claimed in our above-cited copending parent patent application.

It is felt that the improved processing disclosed and claimed in our above-cited copending parent application is equally applicable to the new light-emitting diodes and to the previously disclosed detectors. In either case, the indium phosphide substrate is the light-transmitting window of the device.

As disclosed and claimed in our above-cited copending parent application, a "pre-saturated" mixture of tin, phosphorous, and cadmium tin phosphide is prepared by any of several available techniques to avoid substrate degradation during epitaxial growth on the indium phosphide. Premelting of the solution prior to liquid-phase heteroepitaxy eliminates the necessity of equilibrating the solution at high temperatures prior to tipping and thereby helps to prevent indium phosphide degradation via vapor phase reactions.

As disclosed and claimed in our above-cited copending parent application, displacement of the substrate to a lateral wall of the plug of the closed tipping ampoule, provision of a baffle to impede vapor exchange between the solution and the substrate crystal, and to force a well-mixed flow past the substrate crystal as tipping occurs, and the provision of drain holes in two orientations in the plug to insure continuity of flow of the solution past the substrate crystal surface, are all provided in order to improve the quality of the resulting heterojunction. Also, the tipping ampoule is now filled with helium to a pressure of about 0.87 atmospheres at room temperature to promote improved thermal conductivity and to minimize unwanted vapor transport from the solution to the substrate surface.

Our above-cited parent application was directed to growth of a heterojunction in which current injection is not impaired by recombination centers at the junction. The growth employs the use of a liquid-phase epitaxy technique in which the indium phosphide substrate crystal and the solution of cadmium tin phosphide are maintained at substantially equal temperatures.

We have further discovered that the addition of controlled amounts of indium to the presaturated melt improves the quality of the epitaxy and, in addition, can change the nominal wavelength of the electroluminescence from about 1.4 $\mu$ to about 1.0 $\mu$ (for considerable amounts of indium). The emitting diodes of our present invention are so composed to emit throughout this wavelength range.

BRIEF DESCRIPTION OF THE DRAWING

Further features and advantages of the devices according to our invention will become apparent from the following detailed description taken together with the drawing in which.

DESCRIPTION OF ILLUSTRATIVE EMBODIMENT

Figure 1:
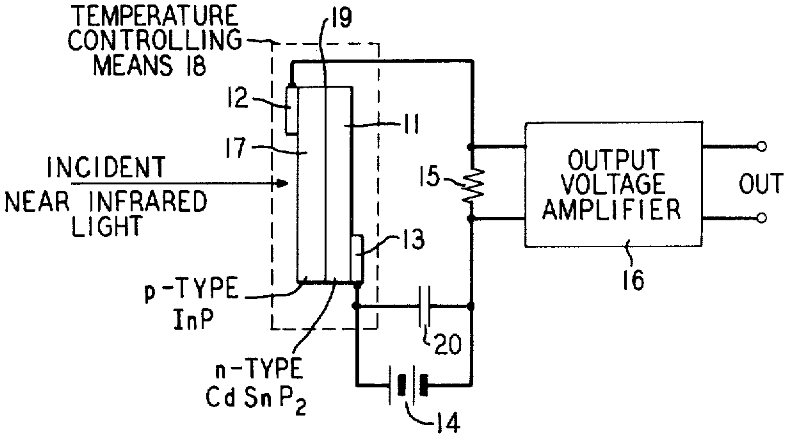
FIG. 1 is a partially pictorial and partially block diagrammatic illustration of a preferred embodiment of our invention used as a detector.

In the embodiment of FIG. 1, it is desired to detect information which has been modulated onto a coherent light beam. Illustratively, the light beam is that of a solid-state neodymium ion laser at 1.06 micrometers; but it could also be a comparable laser in the wavelength range between about 1.0 micrometers and 1.3 micrometers. The modulated beam is incident upon the p-type indium phosphide substrate 17 from the left. The substrate 17 is substantially transparent to the received beam since indium phosphide has a bandgap corresponding to a wavelength of about 0.93 micrometer. A heterojunction 19 is provided at the major surface of substrate 17 at which the light would otherwise pass out of the substrate crystal. Specifically, the epitaxial layer of n-type cadmium tin phosphide is deposited on this surface and provides the heterojunction 19 with the substrate at or near which nearly all of the light absorption occurs. A photovoltaic response is coupled from the heterojunction by electrodes 12 and 13, the former being diffused into substrate 17 with an excess of the acceptor-type impurity of substrate 17 and the latter being soldered into epitaxial layer 11.

The external circuit for the heterodiode includes the series combination of sensing resistor 15 and the dc voltage source 14 connected in series circuit with its negative terminal toward contact 12 and its positive terminal toward contact 13. Illustratively, an output voltage amplifier 16 is provided and has its input circuit connected across sensing resistor 15. For biasing a fast photodiode, such as the heterodiode of the invention, a substantial storage capacitor 20 is connected across source 14.

The overall dimensions of the heterodiode are approximately one mm along the narrow dimension of the junction, times 0.55 to 0.75 mm in the direction of light passage, times approximately one to two mm along the long dimension of the junction. These dimensions are determined largely by the dimensions of the initial substrate crystal 17 which is cleaved on at least four surfaces to minimize surface conduction effects. A typical thickness of the cadmium tin phosphide layer alone was about 0.15 to 0.25 mm.

For a detector diode of our earliest type in which the cadmium tin phosphide layer 11 had a soldered indium contact, the resistivity of the cadmium tin phosphide layer alone was measured to be about 0.01 Ω-cm and a thermal probe indicated n-type conduction.

Figure 2:
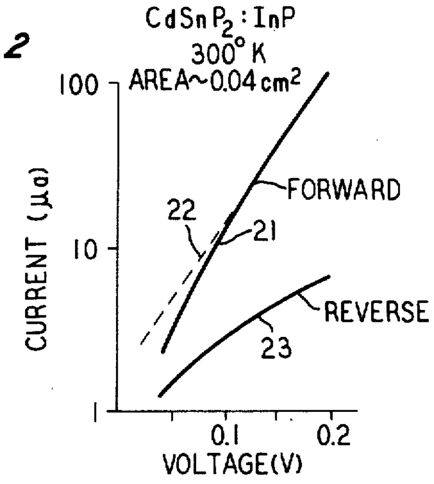
FIGS. 2 and 3 show curves illustrating the operation of early detectors according to our invention.

The room temperature characteristic of a typical detector diode is shown in FIG. 2. Current in microamperes is plotted logarithmically along the vertical axis and voltage in volts is plotted linearly along the horizontal axis. Curve 21 represents the measured forward-bias response of one heterodiode. It will be noted that this forward-biased response approaches the theoretical conduction characteristic defined by the dashed curve 22. The reverse conduction characteristic is shown by the lower curve 23. It is believed that this surprisingly large reverse current can be substantially reduced by further improvements in device fabrication. The rectification properties were observed to be about 16:1 at 0.2V. The slope of the curve 23 near the origin is about 30 kΩ, showing a rather large leakage. Since all four sides of the heterodiode orthogonal to the junction were cleaved, it is unlikely that the leakage is a surface effect. It is more likely that this leakage results from interfacial defects or impurities in the junction region.

Under forward-bias at a temperature of about 77K, a typical heterodiode was observed to have a very weak electroluminescence between about 0.9 μm and about 1.3 μm. This electroluminescence was detected with a photomultiplier. The absence of efficient electroluminescence suggests that only a small fraction of the forward current is associated with carrier injection, lending support to the statement above that the reverse conduction characteristic, curve 23, is dominated by recombination at interfacial defects.

It is this weak electroluminescence which has been surprisingly strengthened, especially at room temperature, by use of the diodes made according to our improved processing technique and with higher resistivity materials. It is believed that the improved diodes have greatly increased the optical quality of the heterojunctions, as compared to the diodes just described above.

Figure 3:
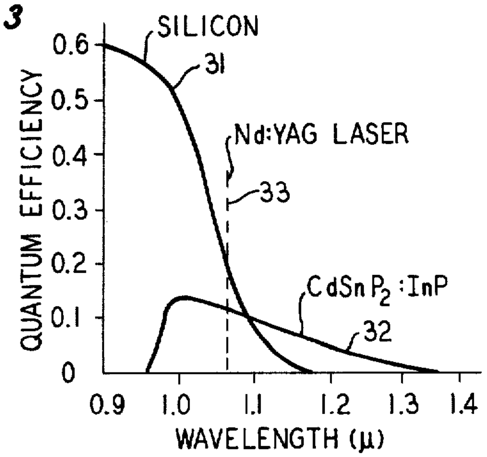

Under reverse-bias, our heterodiodes connected as shown in FIG. 1 perform admirably as infrared photovoltaic detectors. The room temperature quantum efficiency of a typical diode of our earliest type is shown in FIG. 3 and is there compared with the quantum efficiency of a commercially available silicon photodiode. In FIG. 3, quantum efficiency in fractional units is plotted along the vertical axis and wavelength in micrometers is plotted along the horizontal axis. Curve 31 represents the characteristic of the commercially available silicon photodiode. The vertical dashed line 33 is disposed at 1.06 μm wavelength to represent the emission wavelength of the neodymium laser. Curve 32 represents the observed characteristic of one of our heterodiodes of our earliest type. The quantum efficiency of the heterodiode reaches a maximum of 13 percent at a wavelength of 1.01 μm compared with a value of 49 percent at that wavelength for the silicon photodiode.

At longer wavelengths, the decrease in the quantum efficiency of the heterodiode is considerably less rapid than for the silicon detector, so that the response curves cross at 1.09 μm. The quantum efficiency of the heterodiode exceeds 1 percent for all wavelengths between 0.96 and 1.3 μm.

The short wavelength cut-off of the photovoltaic response shown by curve 32 is traceable to the absorption of the substrate material 17, through which the received light should pass in order to be absorbed immediately at the heterojunction. That is, the quantum efficiency becomes negligible for a wavelength shorter than about 0.96 μm because of the absorption in the indium phosphide substrate 17.

A noise voltage of about $10^{-7}$V peak-to-peak was measured at the diode terminals using a lock-in amplifier. This measurement was made for a bandwidth of 1 Hz at a center frequency of 1 kHz. Since this noise voltage is the expected value for Johnson noise in a 30 kΩ resistor at room temperature, there is no evidence for any other source of noise. The noise equivalent power of the present device is about $3\times10^{-11}$ w at a wavelength of 1.01 μm for a noise bandwidth of 1 Hz.

The first growth technique for the detector diodes may be described as follows, with reference to FIGS. 4A and 4B. For the substrate crystal 43 we used a zinc-doped p-type indium phosphide crystal grown by a gradient freeze method of well-known type. That technique is modified by providing crystal growth under almost isothermal conditions in order to assure homogeneous distribution of the dopant and uniform stochiometry of the indium phosphide crystal from which the substrate wafers are cut.

Hall measurements on a typical substrate indicate a resistivity of 0.04 Ω-cm and a mobility of 30 $cm^2/V$-sec. These values correspond to a concentration of free holes of about $5 \times 10^{18}$ $cm^{-3}$. One particular substrate 43 was cut and polished from a single crystal to the dimensions of 1×1.5×0.05 cm with the (100) axis normal to the large face.

Figure 4A:
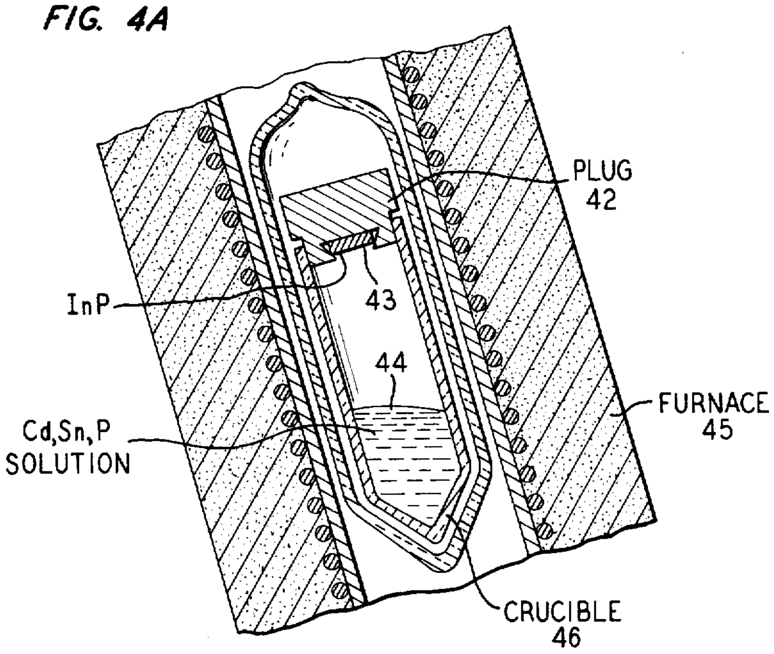
FIGS. 4A and 4B are cross-sectional views of a growth ampoule containing substrate crystal and melt at two successive stages of our first growth procedure.

Epitaxial growth of cadmium tin phosphide on the substrate was achieved from a dilute solution 44 of cadmium and phosphorus in tin, as shown in FIG. 4A. Optimum results were obtained with a solution of atomic composition 1.5% Cd + 8.5% P + 90% Sn. More generally, the atomic proportion of phosphorus to cadmium should be greater than 2:1 and tin to cadmium substantially greater than 10:1. The melt 44 was contained in a vitreous carbon crucible 46 closed off by a plug 42 which held the indium phosphide substrate 43 in a dovetail slit. Carbon crucible 46 was sealed into an evacuated quartz ampoule 41 and placed into a tipping furnace 45.

The furnace temperature was raised to 610° C and held there for one hour to homogenize the melt. Precaution was taken that the substrate crystal and the melt, which are not in contact, as shown in FIG. 4A, were almost at the same temperature in this stage since overheating of the melt with respect to the indium phosphide substrate 43 results in vapor transport of cadmium tin phosphide and tin phosphide onto the substrate. Since this vapor transport occurs in a non-controlled manner the excess tin phosphide ($Sn_4P_3$) leads to the formation of pits in the (100) surface of the InP substrate. After tipping, these pits are filled with tin solution and overgrown from the sides by the $CdSnP_2$ epilayer. Sn inclusions are thus formed in the junction region, which short-out many diodes prepared from such a heterojunction wafer.

Figure 4B:
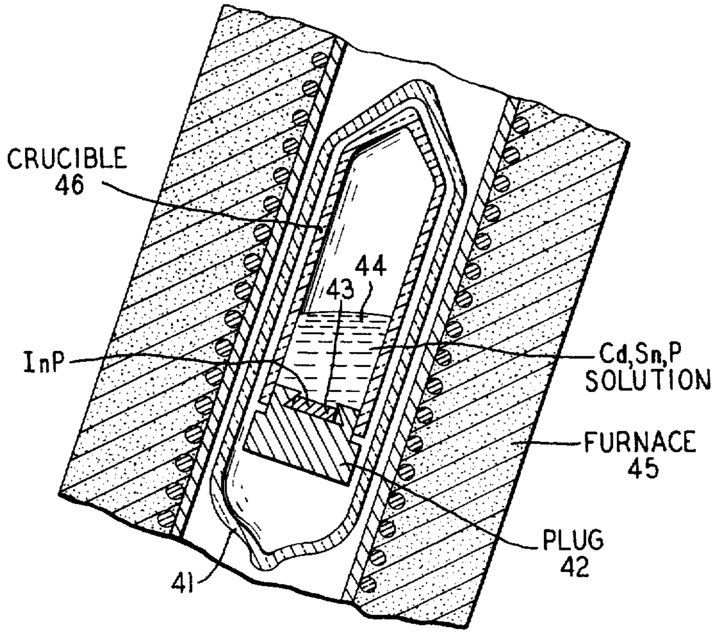

After homogenization, the furnace is cooled rapidly to 510°C and tipped into the position shown in FIG. 4B to bring the solution 44 into contact with the substrate 43. Epitaxial growth was then induced by cooling the furnace at a rate of about 10° C per hour. The substrate was separated from the adherent tin melt by extraction with mercury, for example, as disclosed by E. Buehler et al., *Materials Research Bulletin*, Vol. 6, page 303, 1971. Residual contamination with tin was removed by etching in a mixture of hydrofluoric and nitric acids followed by a chemical polish in a bromine/methanol mixture.

Many diodes with dimensions of 1×2 mm in the plane parallel to the junction were prepared from a single as grown crystal by cleaving the indium phosphide substrate 43 along (110) planes.

As mentioned above, contacts of pure indium were soldered to the cadmium tin phosphide layer. Ohmic contacts to the zinc-doped indium phosphide substrate were achieved by using an In + 5 percent Zn eutectic or Au + 5 percent Zn wire, for the detector diodes of our earliest type.

A specific extraction and cleaning procedure for the device taken from the furnace with the adherent tin melt is as follows:

1. Extract the heterojunction crystals from the Sn by dissolution of the Sn in Hg at 200° C.
2. Remove the heterojunction crystals from the Hg-Sn amalgam and spin off as much excess Hg-Sn as possible by centrifugation of the heterojunction.
3. Place the heterojunction crystals in a vacuum furnace at 180° C for 24 hours to distill off the remaining Hg.
4. Clean the heterojunction crystals in an etch consisting of 100 parts by volume of HF and 2 parts by volume of $HNO_3$ at room temperature until the remaining Sn is completely removed.
5. Flush with $H_2O$ to stop the etching action and decant. Repeat several times to remove all acid.
6. Flush with acetone to remove $H_2O$.
7. Flush with methanol to remove acetone.
8. Decent and add mixture of 100 parts by volume methanol and 1–2 parts by volume Br. Stir until heterojunction crystals look bright.
9. Flush with methanol and decant several times.
10. Dry in clean air.

Further improvement in a heterojunction quality and resulting improvements experienced in light-emitting diode performance are achieved by the following techniques.

First, single crystals of indium phosphide for substrates of suitable quality and sufficiently high resistivity can be grown by any one of three known methods: (1) gradient-freeze method, (2) zone melting and (3) liquid-encapsulated Czochralski-pulling.

In a recent investigation we found that a phosphorus overpressure of 27.5 atmospheres is required over the indium phosphide melt during solidification to maintain stoichiometry of the indium phosphide compound. For InP crystal growth by zone melting and gradient freeze techniques the InP melt is contained in a boat made from either boron nitride, vitreous carbon or fused silica. Best results in terms of purity were obtained with boron nitride boats. The boats, initially filled with n-type InP, are sealed in evacuated quartz ampoules with additions of $ZnP_2$ or $CdP_2$ and excess phosphorus to establish the desired p-type doping of the InP and to generate the necessary phosphorus pressure.

The desired high resistivity is obtained by carefully minimizing all possible sources of contamination and by controlling the amount of doping impurity added, specifically to concentrations of zinc yielding carrier concentrations $N_A$-$N_D$ $5 \times 10^{17}$ $cm^{-3}$ in the InP crystal. When the pulling technique is employed, a liquid encapsulant (usually $B_2O_3$) forms a semi-impermeable layer (about ¼ inch thick) between the melt and a pressurized chamber filled with a chemically inert gas such as nitrogen or argon. The necessary phosphorus pressure over an encapsulated melt is generated from excess phosphorus and retained by the inert gas pressure over the encapsulated melt. Growth is initiated on a seed penetrating the encapsulant and contacting the melt. The seed is withdrawn and rotated uniformly to form a cylindrical boule of solidified indium phosphide. Diameter control is maintained by controlling the temperature of the melt. Anyone skilled in the crystal growth art is familiar with the above. The high-resistivity indium phosphide substrates for use in preparing the improved light-emitting diodes were obtained from commercial sources and are believed to have been made by liquid encapsulated Czochralski technique.

The crystals for substrates should be free of indium inclusions and growth twins. Low dislocation density and homogeneous dopant distribution are desirable. The density of holes should be $5 \times 10^{17}$ cm$^{-3}$. Such a substrate crystal of indium phosphide is now placed in the improved tipping apparatus of FIGS. 5A and 5B for implementation of our improved epitaxial growth process.

Figure 5A:
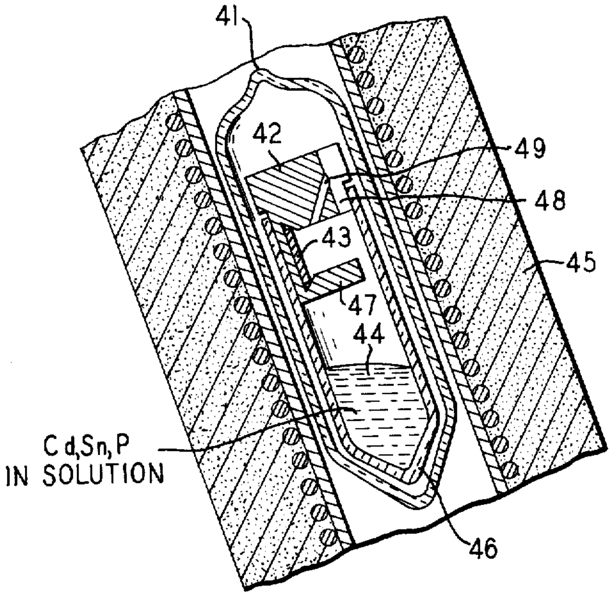
FIGS. 5A and 5B show modifications of FIGS. 4A and 4B according to our second, improved growth procedure.
Figure 5B:
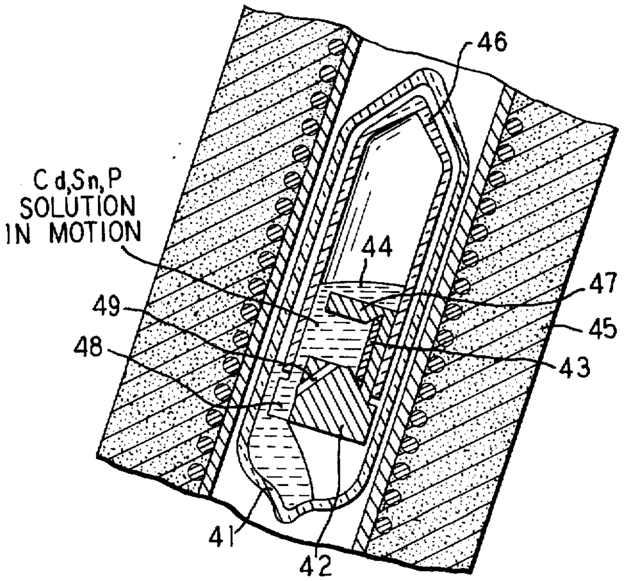

In FIGS. 5A and 5B the indium phosphide substrate is labeled 43. It is placed into a lateral dovetail slit in plug 42 which is inserted in the top of vitreous carbon crucible 46. It is baffled from the vapor of the solution 44 contained in crucible 46 by the baffle 47 which is an extension of the plug 42.

The furnace 45, tipping ampoule 41 and crucible 46 are shown in FIG. 5A in the position desired prior to tipping.

According to our modified procedure, the solution 44 is presaturated prior to placement in crucible 46 so that its homogenization within crucible 46 just prior to tipping can be accomplished by equilibrating at 526°C for about 15 minutes, rather than at 610°C for about 60 minutes. This lower temperature and relatively short heating time is made possible by the following premelting procedure:

1. Solutions of the various compositions listed in table 1 are made by heating the appropriate mixture of the elements (6N purity for Cd, Sn, In and P, 5N purity for Cu, Ag, Au and Li) in vitreous carbon crucibles similar to crucible 46 in FIG. 5A, sealed within evacuated quartz ampoules similar to ampoule 41, for 1 hour to 600°C. In some cases $CdSnP_2$ crystals were used to make up the solutions instead of a mixture of Cd, Sn and P.

2. The ampoules containing the solutions are air quenched from 600°C to room temperature resulting in an intimate mixture of small crystals of $CdSnP_2$, $Sn_4P_3$ and InP embedded in a solid solution of the dopants in Sn.

3. These preconditioned mixtures were loaded into the crucible 46 (FIG. 5A and 5B) and used for the actual LPE run. In our previous work, the heteroepitaxy solution was made up of $CdSnP_2$ and Sn, and no premelting was done prior to heteroepitaxy. The premelting eliminates the necessity of homogenizing the Sn-solution at high temperatures prior to tipping and thereby prevents InP degradation and vapor phase reactions.

The InP substrates are prepared by cutting a p-type indium phosphide boule into 0.020 inch thick wafers each with the [100] axis perpendicular to the largest face. The substrate wafers are lapped on 600 emory paper to remove at least 0.001 inch of InP, followed by Syton polishing for one hour to remove at least another 0.001 inch of material. Syton is a trade name for a chemically active fine abrasive solution. After polishing, the substrates are washed in boiling trichloroethylene to remove residuals of the wax mounting, and dried in clean air. Typically, substrates of 0.09Ω-cm resistivity and carrier concentration $N_A - N_D = 5 \times 10^{17}$/cc are used in our new experiments, whereas the substrates discussed in our above-cited copending patent application were 0.07–0.025Ω-cm with $1\text{–}5 \times 10^{18}$ free holes/cc. Most of the LPE layers were deposited onto (100) substrate surfaces. However, it was found that epitaxial layers can as well be grown on other orientations as, for example, the (111) and (110) surfaces. After the above-described preparation and cleaning procedure, the InP substrate wafer 43 is placed into plug 42 FIG. 5A.

The crucible 46, thus loaded with the premelted solution 44 and substrate 43 mounted in plug 42, is loaded into the fused silica tipping ampoule 41 which is then evacuated, backfilled with He to 0.87 atmospheres at room temperature and sealed. It will be noted that the substrate is now held on a lateral wall of the plug and that the baffle 47 minimizes vapor depositions on the exposed surface of substrate 43 prior to the desired depositions during tipping. It will also be noted that the two drain holes 48 and 49 will allow the interior of the crucible 46 to communicate with the unoccupied interior portion of tipping ampoule 41 during the tipping step shown in FIG. 5B thereby providing smooth, continuous flow of saturated solution past the exposed surface of substrate 43. As mentioned above, the complete assembly, including the substrate, is heated to 526° Centigrade rather than to 610° Centigrade (this heating takes about 60 minutes), and held for fifteen minutes at this temperature, then lowered quickly to 510° Centigrade and held at this temperature for fifteen minutes. Then the assembly is tipped so as to obtain epitaxial growth. Immediately after tipping, the melt and InP are cooled at a rate of 0.147 mV/hour measured with a Pt/Pt-10%Rh thermocouple over a period of 24 hours. This is equivalent to a cooling rate of 15°C/hr. during the first hour and 19°C/hr. during the 24th hour. After 24 hours, the ampoule is at 120°C. Finally, the assembly is removed from the furnace and air cooled. The substrate is separated from the ingot by the procedure described in our above-cited copending application Bachmann-Buehler-Shay-Wernick, Ser. No. 315,359, filed Dec. 15, 1972. The above-described temperature vs. time program for LPE growth is a typical example which results in high quality epi-layers for all the different solution compositions listed in table 1. Variations of the growth procedure are made to optimize the conditions for nucleation and layer growth for each individual solution composition. These variations include lowering the tipping temperature within the limits 510°C to 450°C and decreasing the initial cooling rate within the limits 20°C/hr. to 1°C/hr. The decrease in tipping temperature is necessary to match the initial temperature of the substrate after tipping to the nucleation temperature of the epi-layer, while variations in cooling rate are made to vary the growth rate of the epi-layer. The nucleation temperature as well as the optimum growth rate of the epi-layer depend on both solution concentration and crystallographic orientation of the substrate.

The epitaxial growth process specifically comprising the second part of the tipping procedure can be discussed with reference to FIG. 5B with the entire furnace inverted, or just with the tipping ampoule 41 within furnace 45 inverted so that the heated solution 44 runs past the baffle 47 and flows with good mixing past the exposed surface of substrate 43 and drains continuously through both the diagonal drain hole 49 and the drain hole 48, which is parallel to substrate 43, toward the evacuated space of type ampoule 41. The continuous motion of the solutions past the surface of substrate 43 is found to improve the optical quality of the heterojunction grown. It is also found that the density of defects in the heterojunction interface region is drastically reduced by the flow characteristic promoted by the revised configuration of plug 42 and positioning of substrate 43.

The light-emission efficiency of the diode thus grown is found to be improved greatly, typically more than one order of magnitude and nearly two orders of magnitude as compared to the efficiency of diode grown by the tipping procedure illustrated in FIGS. 4A and 4B.

Figure 6:
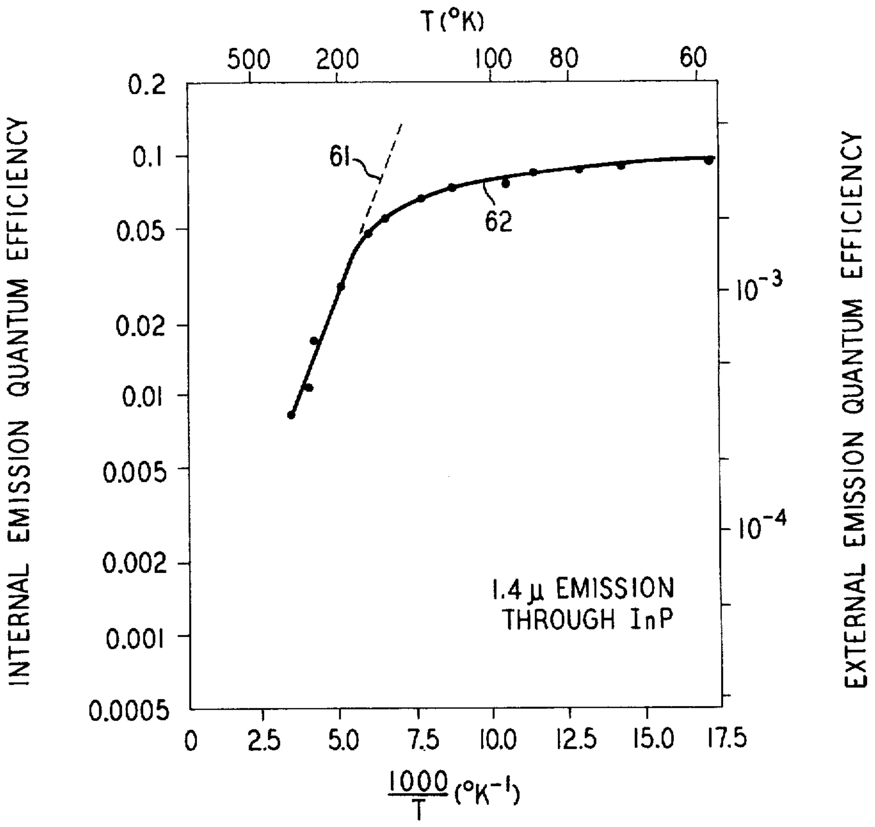
FIG. 6 shows curves illustrating the emission characteristics of a light-emitting diode according to our invention.

More specifically, in FIG. 6, internal emission quantum efficiency is shown along the vertical axis or ordinate of the curves; and 1,000 times the reciprocal of the temperature in degrees Kelvin is shown along the horizontal axis or abscissa. A corresponding scale of temperatures in the degrees Kelvin is also plotted horizontally at the top of the graph; and external emission quantum efficiency is plotted at the righthand vertical edge of the graph. The latter two scales show the direct relationships between absolute temperature and its reciprocal, on the one hand, and internal and external quantum efficiencies, on the other hand. The dashed curve 61 shows the extrapolated straight line characteristic corresponding to the initial slope of the quantum efficiency versus temperature curve; and the experimentally determined curve 62 shows the actual measured values.

It may be seen that the internal emission efficiency varies from about 10 percent (0.1 in fractional units) for temperatures at or below 77° Kelvin down to efficiencies of about one percent (0.01 in fractional units) at room temperature, which is about 293° to 300° Kelvin. At the latter point the external emission quantum efficiency is about 0.05 percent, an amazingly overall high efficiency that suggests the light-emitting diode is already useable in short distance fiber optical communication systems. Our latest diodes have even higher internal efficiencies, two percent at room temperature.

An important point with respect to the results shown in FIG. 6 is that they have been reliably reproduceable for high resistivity materials and for the process illustrated in FIGS. 5A and 5B, whether the substrate is cadmium-doped or zinc-doped. Specifically, samples numbered for purposes of our experiments, as 71, 92, and 93, were grown on Cd doped InP substrates having carrier concentration ($N_A$—$N_D$) = 5 × $10^{17}$ $cm^{-3}$, whereas samples numbered in the same sequence, 94, 95, and 102, were grown on Zn-doped substrates having $N_A$—$N_D$ = 1.2 × $10^{16}$ $cm^{-3}$. All of these samples mentioned yielded high efficiency (1–2 percent) diodes emitting near 1.5 $\mu$. Samples numbered 104 in our experiments, on the other hand, were grown on a Zn-doped InP substrate ($N_A$—$N_D$ = 1.2 × $10^{16}$ $cm^{-3}$) but yielded high efficiency diodes (one percent) emitting near 1.0 $\mu$.

Table 1

| Sample No. | Solution Concentration (Atomic Percent) Sn | Cd | In | Cu | Ag | Li | P |
|---|---|---|---|---|---|---|---|
| 71 | 89.55 | 1.33 | — | .31 | — | — | 8.81 |
| 89 | 87.99 | 5.75 | — | — | — | .59 | 5.67 |
| 92 | 89.90 | 1.34 | — | — | — | — | 8.76 |
| 93 | 89.90 | 1.34 | — | — | — | — | 8.76 |
| 94 | 89.60 | 1.34 | — | .30 | — | — | 8.76 |
| 95 | 94.65 | 1.49 | — | .31 | — | — | 3.55 |
| 96 | 89.85 | 1.35 | — | — | — | — | 8.80 |
| 98 | 89.59 | 1.34 | — | — | .30 | — | 8.77 |
| 99 | 93.25 | .48 | 1.67 | — | — | — | 4.60 |
| 101 | 91.81 | 1.43 | 1.00 | — | — | — | 5.76 |
| 102 | 91.80 | .91 | 1.81 | — | — | — | 5.48 |
| 104 | 92.07 | .19 | 2.71 | — | — | — | 5.03 |
| 112 | 92.49 | 1.22 | .96 | — | — | — | 5.33 |
| 114 | 92.20 | .21 | 2.61 | — | — | — | 4.98 |

Figure 7:
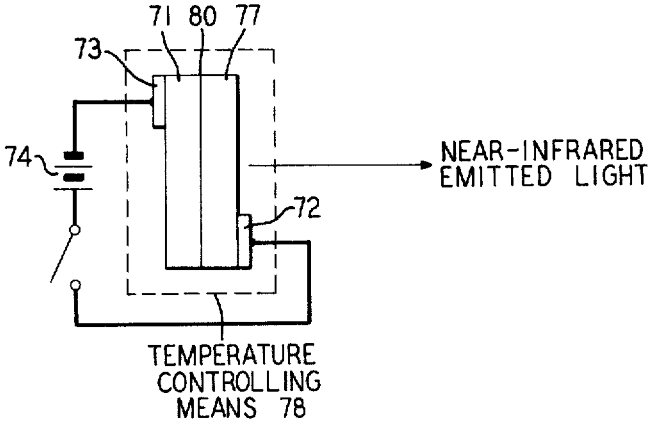
FIG. 7 shows a light-emitting diode according to our invention.

The basic configuration of the light-emitting diodes tested is very simple and is illustrated in FIG. 7. The cadmium tin phosphide epitaxial layer 71 is grown on the indium phosphide substrate 77 as described above in connection with FIGS. 5A and 5B. The resulting heterostructure is removed from the crucible and cleaned in accordance with the cleaning procedure outlined above. It is scored in a regular array and cut into separate diodes measuring about 1 millimeter × 1 millimeter parallel to the heterojunction 80 and having about 0.1 mm greater thickness than the starting substrate material 77 which was typically about ½ millimeter. The electrodes 72 and 73 are deposited by the procedure described above in connection with FIG. 1 and are then connected across terminals of the DC excitation source 74 in the polarity shown, the positive terminal being connected to electrode 72 and the negative terminal to electrode 73. Near-infrared light is emitted through the transparent indium phosphide substrate 77 which serves as a window over its entire exposed major surface. This light was collected by suitable lenses and detectors for the purpose of measuring the high efficiency characteristics shown in FIG. 6. In order to establish the different temperature for the various data points, the diode was enclosed in a suitable refrigerator, which is designated temperature controlling means 78 in FIG. 7.

The current voltage characteristics of the heterodiodes grown on higher resistivity substrates using the improved growth procedure (FIG. 5) are considerably improved relative to the characteristic in FIG. 2. Specifically, a typical current measured on an efficient light-emitting diode (grown on an InP substrate with $N_A$—$N_D$ = 1.2 × $10^{16}$ $cm^{-3}$) for 0.2 volt forward-bias is about 10,000 times less than for the diode in FIG. 2. A very high rectification ratio of 100,000 to 1 is measured for forward and reverse voltages of 1 volt. The slope of the I–V curve at the origin is about 100 MegΩ at room temperature.

Through chemical analysis it has been found that many of the $CdSnP_2$ layers grown by either of the methods shown in FIGS. 4 or 5 contain considerable amounts of indium (as much as six percent). This indium is found to be distributed inhomogeneously through the layer, reaching a maximum at the interface with the indium phosphide substrate. This indium is traceable to dissolution of the indium phosphide substrate by the tin solution prior to nucleation and growth of the epitaxial layer. We have found that the deliberate addition of controlled amounts of indium to the presaturated solution 44 prevents the dissolution of the substrate, improves the nucleation and growth of the layer, and, if added in sufficient amounts, causes the wavelength of the infrared emission to be near 1.0 $\mu$ rather than 1.4 $\mu$ as before. Specifically, if melt 44 contains 2.8 mole percent InP and 0.2 mole percent $CdSnP_2$, the light-emitting diodes as shown in FIG. 7 emit light near 0.99 $\mu$ with an internal quantum efficiency of one percent at room temperature. Infrared emission near 1.4 $\mu$ can be obtained by the addition of less indium to the melt 44. For example, for a melt 44 containing two mole percent InP and one mole percent $CdSnP_2$, infrared emission near 1.4 $\mu$ is measured with an internal quantum efficiency of one percent at room temperature. The composition of the quaternary compound layer grown on the indium phosphide substrate depends on the initial ratio of cadmium:tin:indium:-phosphorus in the solution.

We claim:

1. A detector for near-infrared radiation of the type comprising a crystalline body of $CdSnP_2$ in which said radiation can be absorbed and means including electrodes attached to said device for coupling an electrical response out of said device in response to the incidence of said radiation on said body, said detector being improved in that it includes an InP crystal oriented with respect to said body to intercept said radiation first, said crystal and said body forming a heterojunction near which said radiation is absorbed, one of said electrodes being attached to said InP crystal and another of said electrodes being attached to said $CdSnP_2$ body for coupling said electrical response from said device.

2. A detector according to claim 1 in which the crystalline body of $CdSnP_2$ is an epitaxial single crystal layer, the InP layer forming a single crystal substrate for said epitaxial layer.

3. A detector according to claim 1 in which the crystalline body of a composition including cadmium, tin, indium and phosphorus is an epitaxial single crystal layer, the InP layer forming a single crystal substrate for said epitaxial layer.

4. A detector for near-infrared radiation, comprising a single-crystal substrate of InP, a single-crystal layer of $CdSnP_2$ containing substantial amounts of indium, and first and second electrodes ohmically contacting said substrate and said layer respectively.

5. A light-emitting diode of the type comprising a crystalline body of cadmium tin phosphide ($CdSnP_2$) and electrode means for electrically coupling to said body, said diode being characterized by a single crystal of p-type indium phosphide (InP) forming a substantially strain-free heterojunction with said body, said electrode means providing electrical coupling through said crystal and said body in series, said cadmium tin phosphide body being n-type and containing at least one p-type dopant that tends to compensate it.

6. A detector for near-infrared radiation of the type comprising a crystalline body of a composition including cadmium, tin, indium and phosphorus in which said radiation can be absorbed and means including electrodes attached to said device for coupling an electrical response out of said device in response to the incidence of said radiation on said body, said detector being improved in that it includes an InP crystal oriented with respect to said body to intercept said radiation first, said crystal and said body forming a heterojunction near which said radiation is absorbed, one of said electrodes being attached to said InP crystal and another of said electrodes being attached to said body of composition including cadmium, tin, indium and phosphorus for coupling said electrical response from said device.

7. A detector for near-infrared radiation, comprising a single crystal substrate of InP, a single crystal layer of a composition including cadmium, tin, indium and phosphorus and forming a heterojunction with said substrate, said indium being present in said layer with a graded concentration decreasing with distance from said heterojunction, and first and second electrodes contacting said substrate and said layer respectively.

8. A light-emitting diode of the type comprising a quaternary crystalling body of a composition of cadmium tin, indium and phosphorus in proportions selected to determine the peak electroluminescent wavelength and spectral distribution of the diode and electrode means for electrically coupling to said body, said diode being characterized by a single crystal of p-type indium phosphide (InP) forming a substantially strain-free heterojunction with said body, said electrode means providing electrical coupling through said crystal and said body in series, said quarternary body consisting of cadmium, tin, indium and phosphorus, being n-type and containing at least one p-type dopant that tends to compensate it.

* * * * *